United States Patent
Long et al.

(10) Patent No.: US 10,734,195 B2
(45) Date of Patent: Aug. 4, 2020

(54) SYSTEMS AND METHODS FOR TRANSFORMER COUPLED PLASMA PULSING WITH TRANSFORMER COUPLED CAPACITIVE TUNING SWITCHING

(71) Applicant: Lam Research Corporation, Fremont, CA (US)

(72) Inventors: Maolin Long, Santa Clara, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 337 days.

(21) Appl. No.: 15/617,366

(22) Filed: Jun. 8, 2017

(65) Prior Publication Data
US 2018/0358205 A1 Dec. 13, 2018

(51) Int. Cl.
*C23C 16/00* (2006.01)
*H01L 21/326* (2006.01)
(Continued)

(52) U.S. Cl.
CPC ...... *H01J 37/32091* (2013.01); *H01J 37/321* (2013.01); *H01J 37/3244* (2013.01); *H01J 37/32137* (2013.01); *H01J 37/32146* (2013.01); *H01J 37/32174* (2013.01); *H01J 2237/334* (2013.01); *H03H 7/38* (2013.01)

(58) Field of Classification Search
CPC .............. H01J 37/321; H01J 37/3211; H01J 37/32119; H01J 37/32128; H01J 37/32137; H01J 37/32146; H01J 37/32155; H01J 37/32165; H01J 37/32174; H01J 37/32183
See application file for complete search history.

(56) References Cited

U.S. PATENT DOCUMENTS 9,293,353 B2   3/2016 Long et al.
9,378,931 B2   6/2016 Kwon et al.
(Continued)

FOREIGN PATENT DOCUMENTS

JP   2010-238881 A   10/2010
JP   2016-009733 A   1/2016
KR   10-2016-0050396 A   5/2016

OTHER PUBLICATIONS

Maolin Long et al.; U.S. Appl. No. 16/007,481, filed Jun. 13, 2018 entitled "Direct Drive RF Circuit for Substrate Processing Systems"; 37 pages.
(Continued)

*Primary Examiner* — Luz L Alejandro Mulero

(57) ABSTRACT

A substrate processing system includes a processing chamber including a substrate support to support a substrate. A coil is arranged around the processing chamber. A first RF source provides first RF power at a first magnitude and a first frequency. A first pulsing circuit applies a duty cycle to the first RF source. A tuning circuit receives an output of the first pulsing circuit, includes a first variable capacitor, and has an output in communication with the coil to generate plasma in the processing chamber. A controller includes a data acquisition module to generate feedback. A feedback control module controls at least one of the first frequency and the first variable capacitor based on the feedback and a gain value. The controller selects the gain value based on at least one of the first frequency and the duty cycle.

16 Claims, 12 Drawing Sheets

(51) Int. Cl.
*H01J 37/32* (2006.01)
*H03H 7/38* (2006.01)

(56) References Cited

U.S. PATENT DOCUMENTS

| | | | |
|---|---|---|---|
| 9,455,153 B2 | 9/2016 | Koguchi et al. | |
| 9,515,633 B1 | 12/2016 | Long et al. | |
| 9,583,357 B1 | 2/2017 | Long et al. | |
| 9,711,375 B2 | 7/2017 | Terauchi et al. | |
| 2003/0196757 A1* | 10/2003 | Todorow | H01J 37/321 |
| | | | 156/345.24 |
| 2006/0088655 A1* | 4/2006 | Collins | C23C 14/48 |
| | | | 427/8 |
| 2008/0179948 A1 | 7/2008 | Nagarkatti et al. | |
| 2011/0214811 A1* | 9/2011 | Ashida | C23C 16/50 |
| | | | 156/345.28 |
| 2012/0000887 A1* | 1/2012 | Eto | H01J 37/321 |
| | | | 216/61 |
| 2012/0000888 A1 | 1/2012 | Kawasaki et al. | |
| 2013/0135058 A1* | 5/2013 | Long | H03H 7/38 |
| | | | 333/32 |
| 2016/0293382 A1 | 10/2016 | Sato et al. | |
| 2017/0040174 A1 | 2/2017 | Long et al. | |

OTHER PUBLICATIONS

International Search Report and Written Opinion for PCT Application No. PCT/US2018/035026 dated Sep. 21, 2018; 8 pages.

* cited by examiner

SYSTEMS AND METHODS FOR TRANSFORMER COUPLED PLASMA PULSING WITH TRANSFORMER COUPLED CAPACITIVE TUNING SWITCHING

FIELD

The present disclosure relates generally to substrate processing systems and more particularly to systems and methods for transformer coupled plasma (TCP) pulsing with transformer coupled capacitive tuning (TCCT) switching.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma.

SUMMARY

A substrate processing system includes a processing chamber including a substrate support to support a substrate. A coil is arranged around the processing chamber. A first RF source provides first RF power at a first magnitude and a first frequency. A first pulsing circuit applies a duty cycle to the first RF source. A tuning circuit receives an output of the first pulsing circuit, includes a first variable capacitor, and has an output in communication with the coil to generate plasma in the processing chamber. A controller includes a data acquisition module to generate feedback. A feedback control module controls at least one of the first frequency and the first variable capacitor based on the feedback and a gain value. The controller selects the gain value based on at least one of the first frequency and the duty cycle.

In other features, a VI probe senses a current and a voltage of the plasma. A phase/magnitude detector detects a phase and a magnitude of the plasma. The data acquisition module generates the feedback based on outputs of the VI probe and the phase/magnitude detector.

In other features, the controller includes a gain lookup table that is indexed by at least one of the duty cycle and the first frequency and that outputs the gain value. The controller includes a masking period lookup table that is indexed by at least one of the first frequency and the duty cycle and that outputs a masking period to the data acquisition module. The controller includes a data acquisition lookup table that is indexed by at least one of the frequency and the duty cycle and that outputs a data acquisition period to the data acquisition module.

In other features, the controller adjusts a number of samples for averaging performed by the data acquisition module on the feedback based on at least one of the frequency and the duty cycle. The controller further includes a feedforward controller to determine coarse tuning of the variable capacitance and the first frequency. The feedforward controller includes a learned lookup table indexed by at least three of chamber pressure, gases, gas flow rates, pulsing frequency, RF power and RF bias power.

In other features, the feedforward controller includes a neural network having an input including at least three of chamber pressure, gases, gas flow rates, pulsing frequency and RF power and RF bias power. The first RF source provides second RF power at a second magnitude and a second frequency. The first pulsing circuit outputs a first portion of the duty cycle at the first frequency and the first magnitude and a second portion of the duty cycle at the second frequency and the second magnitude.

In other features, the feedback control module further controls the second frequency.

In other features, a second RF source outputs third RF power at a third magnitude and a third frequency and fourth RF power at a fourth magnitude and a fourth frequency. A second pulsing circuit applies the duty cycle to the second RF source and has an output in communication with the substrate support.

In other features, the feedback control module further controls the third frequency and the fourth frequency. The second pulsing circuit outputs a first portion of the duty cycle at the third frequency and the third magnitude and a second portion of the duty cycle at the fourth frequency and the fourth magnitude.

In other features, the coils include first and second coils and the tuning circuit includes a matching circuit including the first variable capacitor and a second variable capacitor. A power splitter splits power between the first and second coils and including a third variable capacitor and a fourth variable capacitor.

In other features, the feedback control module controls the first frequency and capacitance values of the first variable capacitor, the second variable capacitor, the third variable capacitor and the fourth variable capacitor based on at least one of the feedback and the gain value.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems and methods according to the present disclosure include transformer coupled capacitive tuning (TCCT) circuits with variable capacitors for impedance matching and/or power splitting. The substrate processing systems and methods according to the present disclosure operate in mixed mode pulsing (MMP) operating modes during which TCP RF power and/or bias RF power is pulsed at a duty cycle and one or more pulsing frequencies. The duty cycle of the MMP operating modes can be varied from 1% to 99%.

In some examples, voltage and current measurements are made using an adjustable mask period and a data acquisition period that are selected based on at least one of the pulsing frequencies and/or the duty cycle. In some examples, the controller uses feedforward control with learning capability such as learned lookup tables or trained neural networks to tune directly into a steady state position without going through iterations normally required by a feedback controller. In some examples, the controller uses feedforward control for coarse tuning and adaptive feedback control thereafter. In still other examples, variable data averaging that is specific to a pulsing condition (as defined by the duty cycle and pulsing frequency) is used.

Figure 1:
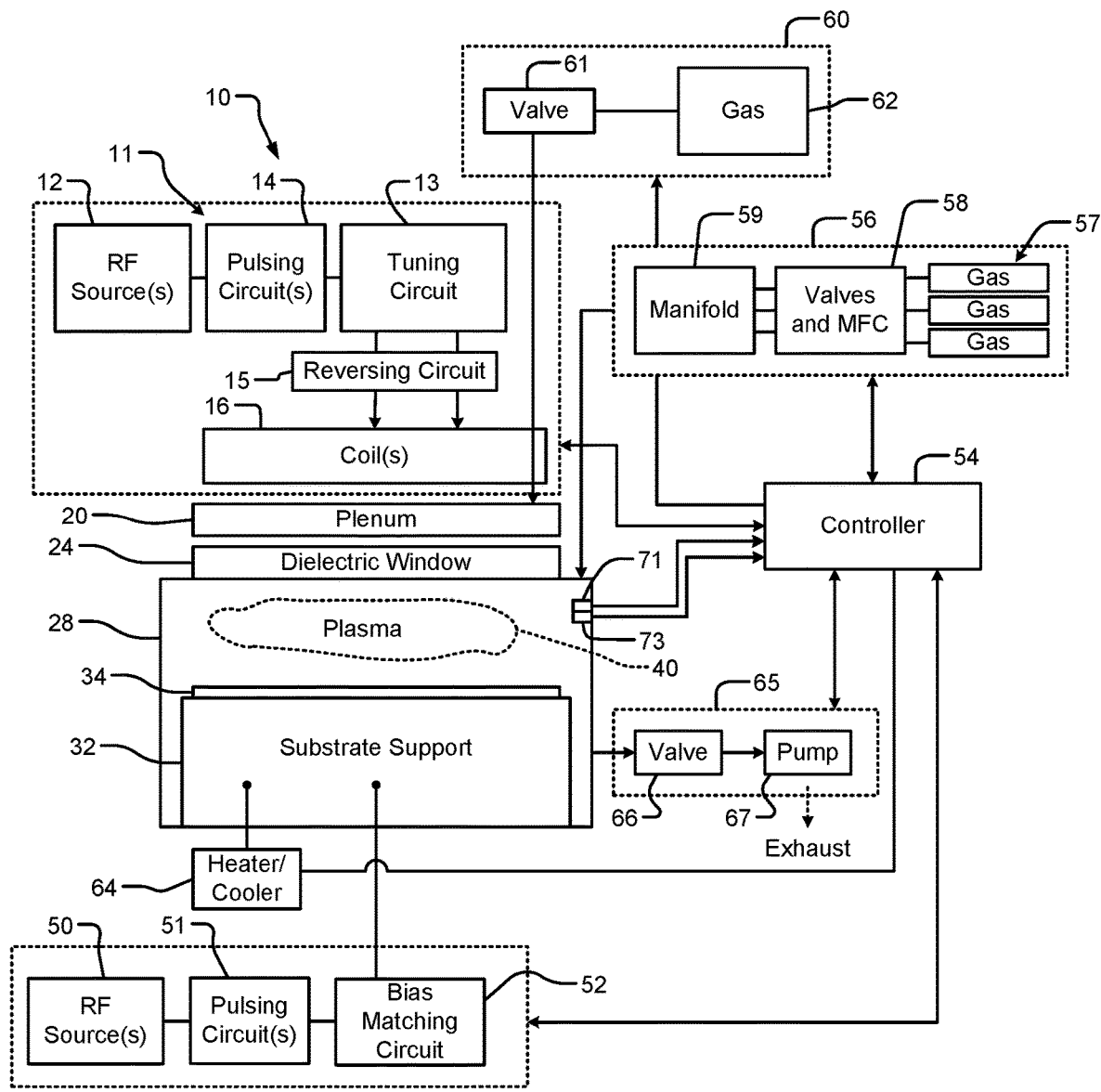
FIG. 1 is a functional block diagram of an example of an inductively coupled plasma (ICP) substrate processing system according to the present disclosure.

Referring now to FIG. 1, an example of a substrate processing system 10 according to the present disclosure is shown. The substrate processing system 10 includes a coil driving circuit 11. In some examples, the coil driving circuit 11 includes a pulsing circuit 14, an RF source 12 and a tuning circuit 13. The pulsing circuit 14 controls a TCP envelope of the RF signal and varies a duty cycle of TCP envelope between 1% and 99% during operation. As can be appreciated, the pulsing circuit 14 and the RF source 12 can be combined or separate.

The tuning circuit 13 may be directly connected to one or more inductive coils 16. Alternatively, the tuning circuits 13 may be connected by an optional reversing circuit 15 to one or more of the coils 16. The tuning circuit 13 tunes an output of the RF source 12 to a desired frequency and/or a desired phase, matches an impedance of the coils 16 and splits power between the coils 16. The reversing circuit 15 is used to selectively switch the polarity of current through one or more of the coils 16.

Examples of the reversing circuit 15 are shown and described in commonly assigned U.S. patent application Ser. No. 14/673,174 by Sato et al., titled "Systems And Methods For Reversing RF Current Polarity At One Output Of A Multiple Output RF Matching Network," filed Mar. 30, 2015, which is hereby incorporated by reference in its entirety.

In some examples, a plenum 20 may be arranged between the coils 16 and a dielectric window 24 to control the temperature of the dielectric window with hot and/or cold air flow. The dielectric window 24 is arranged along one side of a processing chamber 28. The processing chamber 28 further comprises a substrate support (or pedestal) 32. The substrate support 32 may include an electrostatic chuck (ESC), or a mechanical chuck or other type of chuck. Process gas is supplied to the processing chamber 28 and plasma 40 is generated inside of the processing chamber 28. The plasma 40 etches an exposed surface of the substrate 34. An RF source 50, a pulsing circuit 51 and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the plenum 20. The gas may include cooling gas (air) that is used to cool the coils 16 and the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation.

A voltage (V) and current (I) probe (or VI probe) 71 is arranged in the processing chamber to detect voltage and current of the plasma. In addition, a phase/magnitude detector 73 is arranged in the processing chamber to detect a phase and magnitude of the plasma.

A controller 54 may be used to control the etching process. The controller 54 monitors system parameters and controls delivery of the gas mixture, striking, maintaining and extinguishing the plasma, removal of reactants, supply of cooling gas, and so on. Additionally, as described below in detail, the controller 54 may control various aspects of the coil driving circuit 11, the RF source 50, and the bias matching circuit 52, etc.

Figure 2:
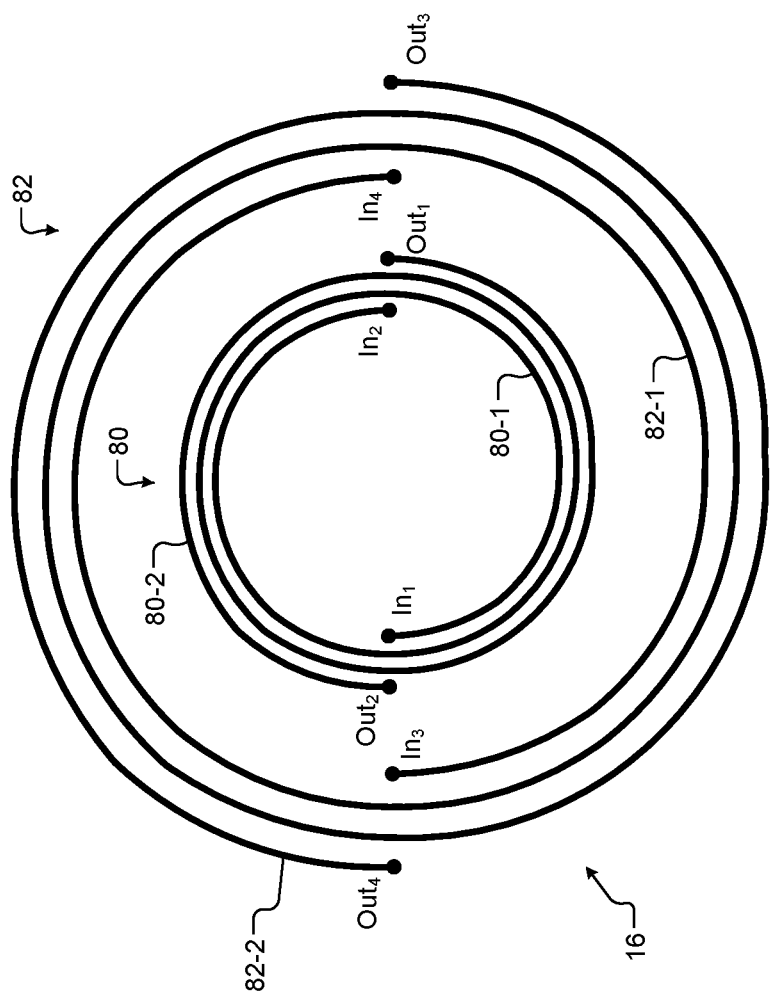
FIG. 2 is a plan view of an example of inner and outer coils according to the present disclosure.

Referring now to FIG. 2, an example of the coils 16 is shown. While a specific coil configuration is shown in FIG. 2, other coil arrangements may be used. The coils 16 may include an inner coil 80 and an outer coil 82. The inner coil 80 includes a first conductor 80-1 having an input end $In_1$ and an output end $Out_1$ and a second conductor 80-2 having an input end $In_2$ and an output end $Out_2$. The first conductor 80-1 and the second conductor 80-2 are wound in a generally circular or looped path adjacent to each other. The outer coil 82 includes a first conductor 82-1 having an input end $In_3$ and an output end $Out_3$ and a second conductor 82-1 having an input end $In_4$ and an output end $Out_4$. The first conductor 82-2 and the second conductor 82-2 are wound in a generally circular or looped path adjacent to each other.

Figure 3:
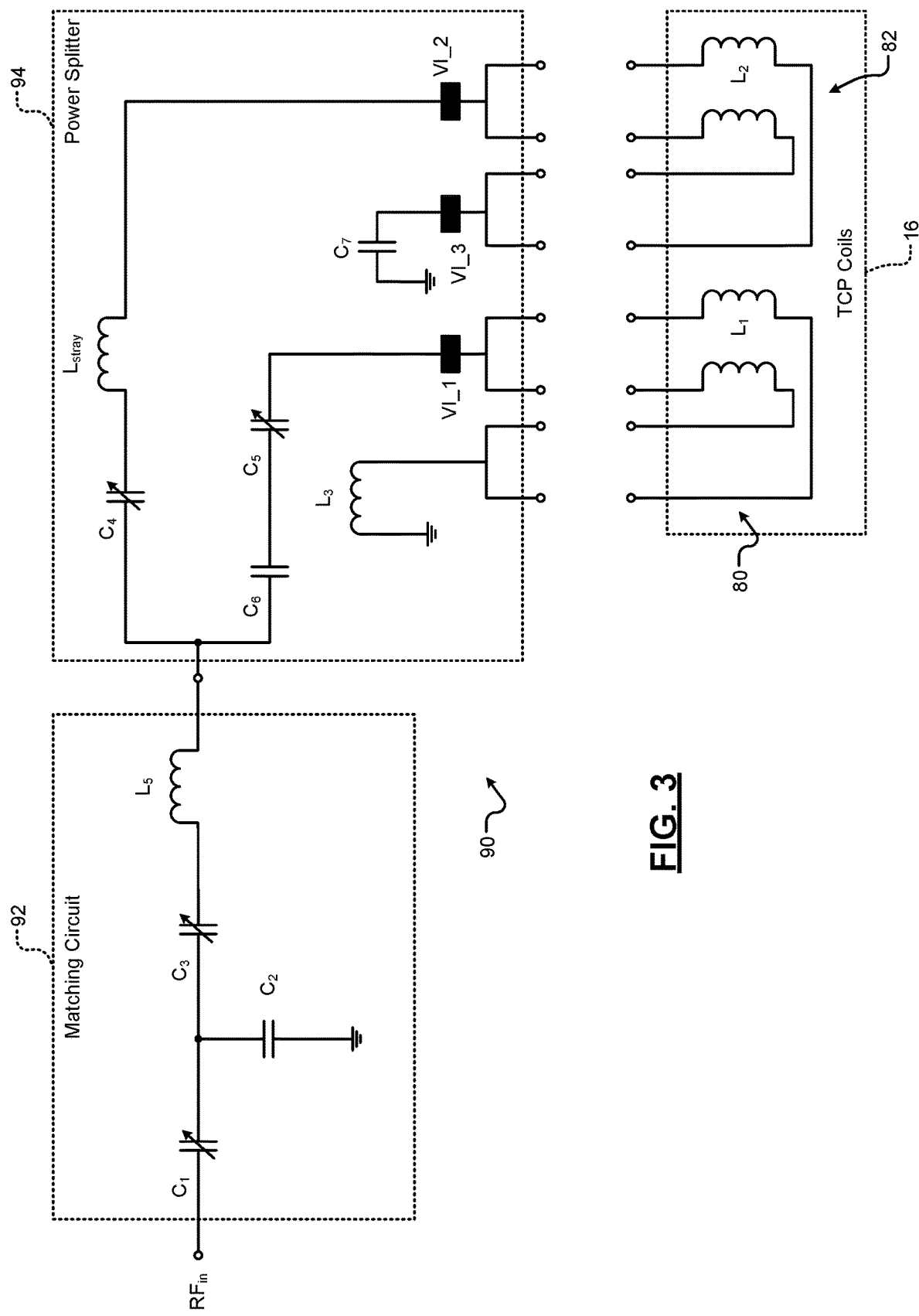
FIG. 3 is an electrical schematic of an example of a transformer coupled capacitive tuning (TCCT) circuit according to the present disclosure.

Referring now to FIG. 3, an example of a TCCT circuit 90 (such as tuning circuit 13) includes a matching circuit 92 and a power splitter 94 that drive the coils 16. The matching circuit 92 receives an RF input signal $RF_{IN}$ from the RF source 12. The matching circuit 92 includes a plurality of capacitors $C_1$, $C_2$, and $C_3$, and an inductor $L_5$. The RF input signal $RF_{IN}$ is received at a first terminal of the capacitor $C_1$. A second terminal of the capacitor $C_1$ is connected to first terminals of the capacitors $C_2$ and $C_3$. A second terminal of the capacitor $C_3$ is connected to a first terminal of the inductor $L_5$.

In some examples, the capacitors $C_1$ and $C_3$ are variable capacitors having capacitance values that are adjusted to match an impedance of the coils (and the plasma). In some examples, the capacitors $C_1$ and $C_3$ are switched capacitor circuits including two or more capacitors and at least one switch. Examples of switched capacitors are shown and described in commonly-assigned U.S. Pat. No. 9,515,633, entitled "Transformer Coupled Capacitive Tuning Circuit With Fast Impedance Switching for Plasma Etch Chambers" and issued on Dec. 6, 2016, which is hereby incorporated by reference in its entirety. In some examples, the capacitors $C_1$ and $C_3$ include motor-controlled vacuum capacitors. The matching circuit 92 matches the impedance of the RF source 12 to the impedance of the coils 16. Values of the variable capacitors $C_1$ and $C_3$ are varied to match the impedance of the coils 16 during operation as will be described further below. The output of the matching circuit 92 is connected to the power splitter 94.

The power splitter 94 is coupled to the inner and outer coils 80, 82 (i.e., the coils 16) as shown. The power splitter 94 supplies the RF power received from the matching circuit 92 to the inner and outer coils 80, 82. The power splitter 94 includes a plurality of capacitors $C_4$, $C_5$, $C_6$, $C_7$, and inductors $L_{stray}$ (of strap) and $L_3$. A second terminal of the inductor $L_5$ is connected to first terminals of the capacitors $C_4$ and $C_6$. A second terminal of the capacitor $C_4$ is connected to first ends of the coil $L_2$ via the strap (having stray inductance $L_{stray}$). Second ends of the coil $L_2$ are connected to a capacitor $C_7$. A second terminal of the capacitor $C_6$ is connected to a first terminal of the capacitor $C_5$. A second terminal of the capacitor $C_5$ is connected to first ends of the coil $L_1$. Second ends of the coil $L_1$ are connected to the inductor $L_3$.

In some examples, the capacitors $C_4$ and $C_5$ are variable capacitors. In some examples, the variable capacitors $C_4$ and $C_5$ are switched capacitor circuits including two or more capacitors and at least one switch. In some examples, the capacitors $C_4$ and $C_5$ include motor-controlled vacuum capacitors. Values of the capacitors $C_4$ and $C_5$ may be varied in conjunction with (or independently from) the values of the variable capacitors $C_1$ and $C_3$.

In some examples, mixed mode pulsing (MMP) may be used to drive the coils 16 and the substrate support 32. Examples of MMP are shown and described in commonly assigned U.S. patent application Ser. No. 14/863,331 by Long et al., titled "Systems And Methods For Reverse Pulsing," filed Sep. 23, 2015, which is hereby incorporated by reference in its entirety.

Referring now to FIGS. 4A-4D, some examples of MMP are shown. Briefly, in mixed mode pulsing, signals from the RF sources 12 and 50 are synchronized to a clock (shown as Clk) defining a duty cycle. A signal from the RF source 12 (shown as TCP) is pulsed in a manner that is alternating or offset in time from a signal from the RF source 50 (shown as RF Bias). Signal levels or magnitudes of the two signals may vary. Also, a duty cycle of the clock may vary between 1% and 99%.

In some examples, the controller 54 shown in FIG. 1 may generate the clock and synchronize the two signals to the clock such that the signal from the RF source 12 is pulsed offset in time from the signal from the RF source 50 as shown in FIGS. 4A-4D. The controller 54 may also control the amplitudes of the two signals as shown.

Figure 4B:
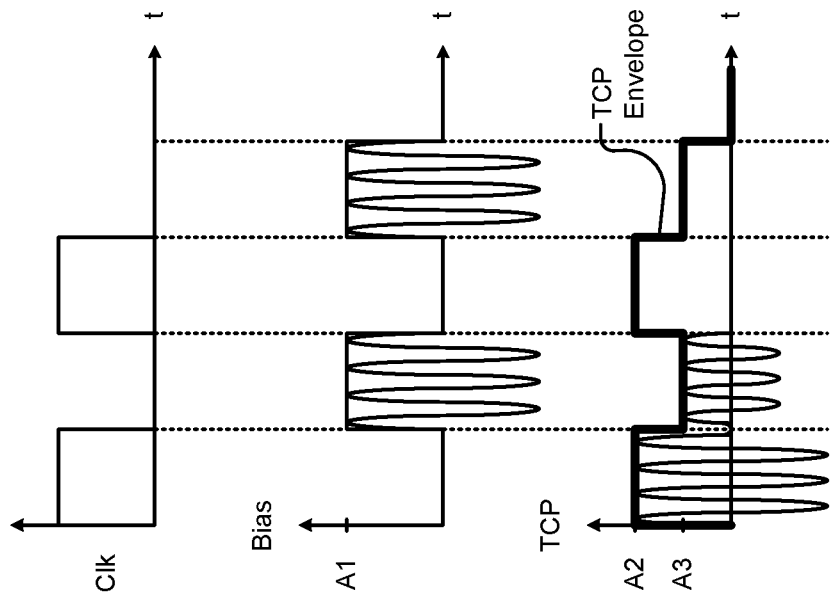
FIGS. 4A-4D are graphs illustrating examples of RF input signals and TCP and RF bias signals during some operating modes according to the present disclosure.
Figure 4A:
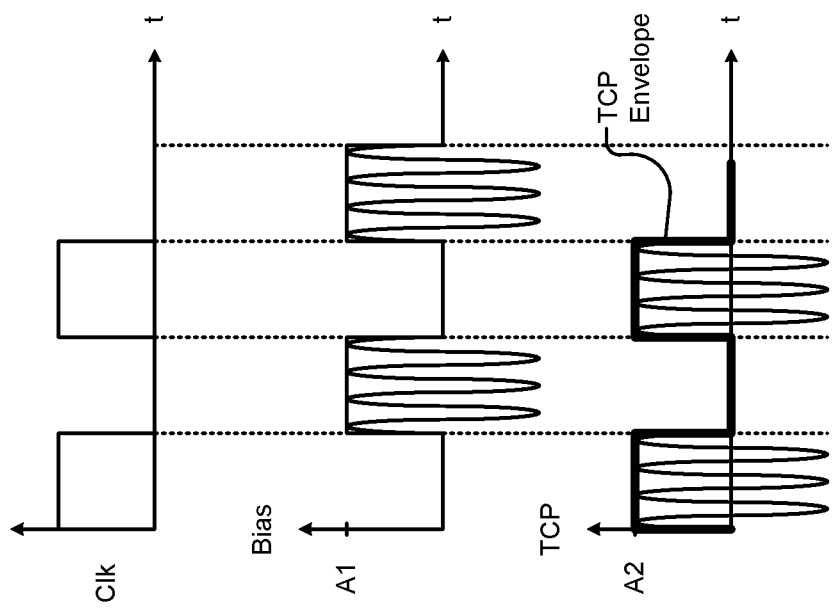

For example, in FIG. 4A, the signal from the RF source 50 may have a level 0 during a first portion of the clock and a level A1 during a second portion of the clock. The signal from the RF source 12 may have a level A2 during the first portion of the clock and a level 0 during the second portion of the clock. In some examples, a period defined by the first portion and the second portion corresponds to one clock cycle. Alternatively, in FIG. 4B, the signal from the RF source 50 may have a level 0 during a first portion of the clock and a level A1 during a second portion of the clock. The signal from the RF source 12 may have a level A2 during the first portion of the clock and a level A3 during the second portion of the clock.

Figure 4D:
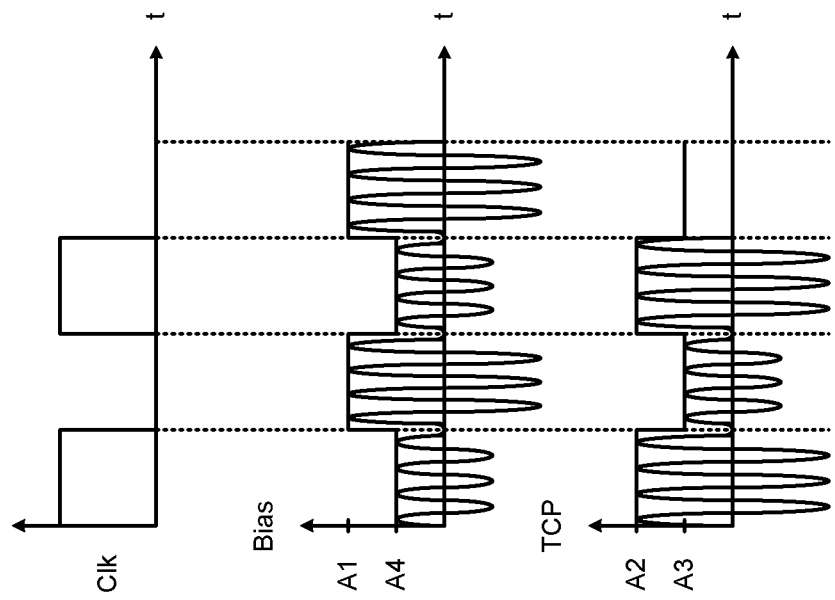
Figure 4C:
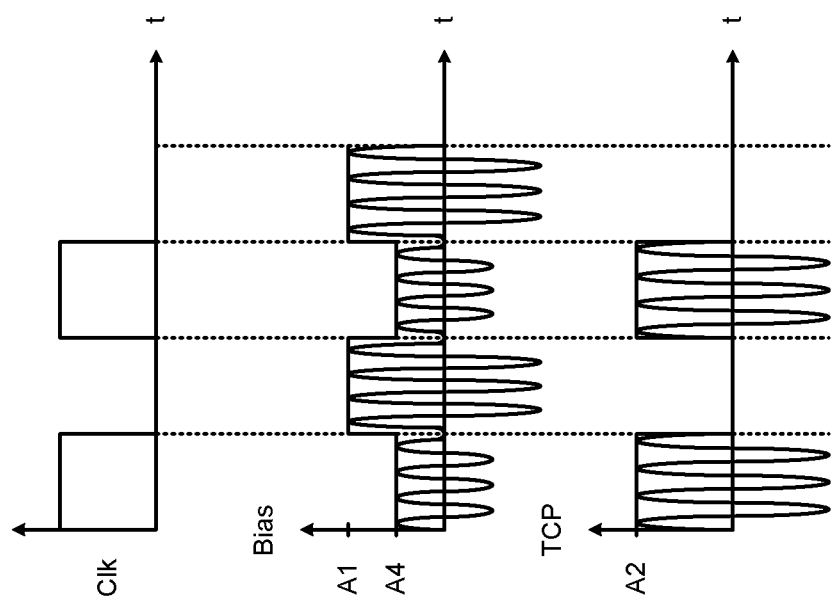

In other examples, in FIG. 4C, the signal from the RF source 50 may have a level A4 during a first portion of the clock and a level A1 during a second portion of the clock. The signal from the RF source 12 may have a level A2 during the first portion of the clock and a level 0 during the second portion of the clock. Alternatively, in FIG. 4D, the signal from the RF source 50 may have a level A4 during a first portion of the clock and a level A1 during a second portion of the clock. The signal from the RF source 12 may have a level A2 during the first portion of the clock and a level A3 during the second portion of the clock.

In some examples, as further shown and described in commonly assigned U.S. patent application Ser. No. 14/863,331 by Long et al., each of the RF sources 12 and 50 may include multiple RF signal generators. In each of the RF sources 12 and 50, the multiple RF signals may have different frequencies and different signals levels. The multiple RF signals may be synchronized to the clock signal. The multiple RF signals may be combined to produce combined signals that respectively drive the coils 16 and the substrate support 32 using the mixed mode pulsing.

Figure 5B:
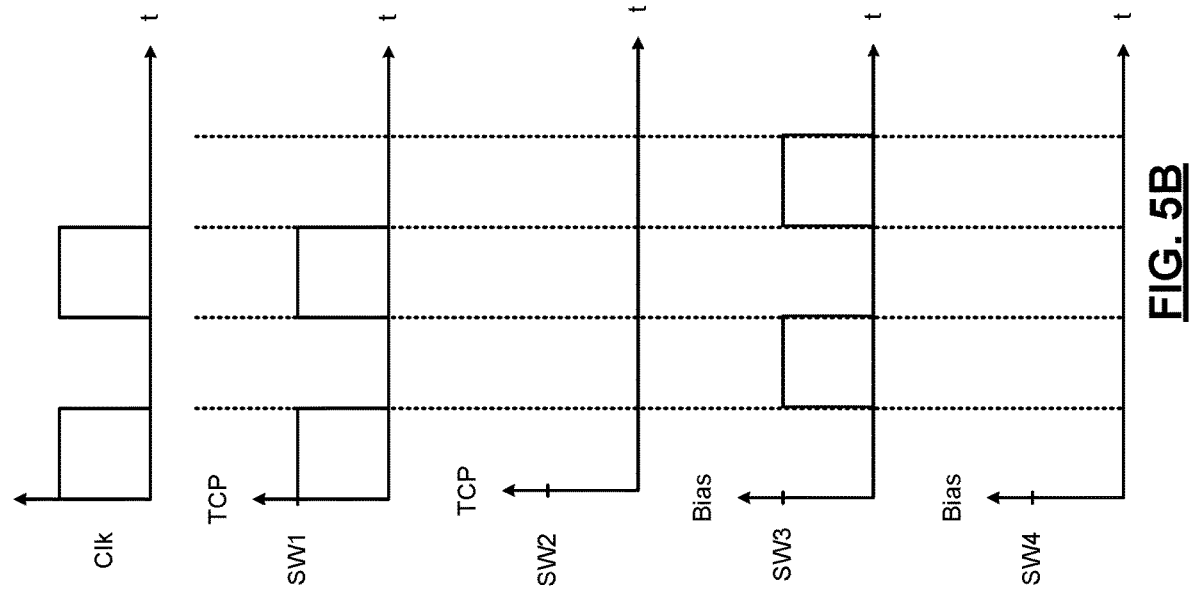
FIGS. 5B-5E are graphs illustrating examples of switch control signals for the switches in FIG. 5A as a function of time during different modes.
Figure 5A:
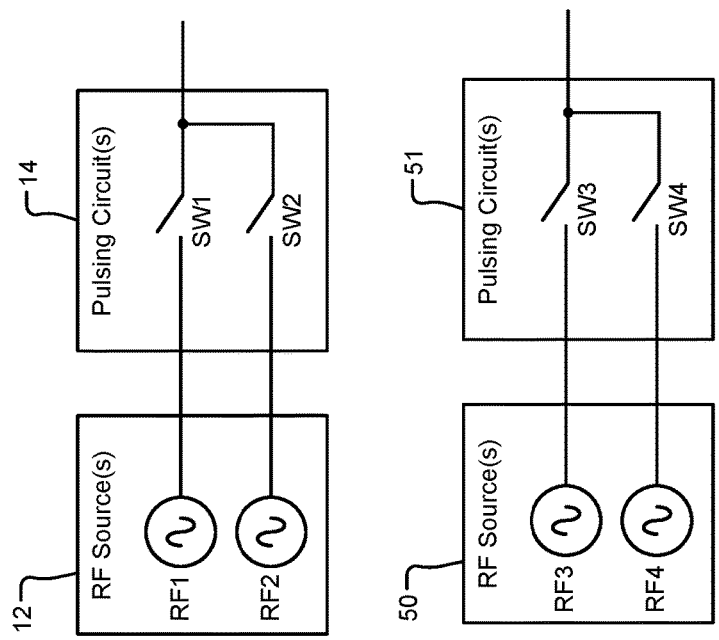
FIG. 5A illustrates examples of pulsing circuits for TCP RF power and bias RF power according to the present disclosure.

Referring now to FIG. 5A, pulsing circuits 14, 51 for TCP RF power and bias RF power are shown. The RF source 12 includes one or more RF sources. In this example, the RF source 12 includes a first RF source RF1 and a second RF source RF2. The pulsing circuit 14 includes a first switch SW1 connected to the first RF source RF1 and a second switch SW2 connected to the second RF source RF2. The switches SW1 and SW2 are controlled to selectively supply the first or second RF sources RF1 and RF2 or neither.

The RF source 50 includes one or more RF sources. In this example, the RF source 50 includes a third RF source RF3 and a fourth RF source RF4. The pulsing circuit 51 includes a third switch SW3 connected to the third RF source RF3 and a fourth switch SW4 connected to the fourth RF source RF4. The switches SW3 and SW4 are controlled to selectively supply the third or fourth RF sources RF3 and RF4 or neither. The duty cycle defined by the switches SW1 and/or SW2 can be the same as or different than a duty cycle defined by the switches SW3 and/or SW4.

Referring now to FIGS. 5B-5E, examples of switch control signals for the switches in FIG. 5A are shown as a function of time. In FIG. 5B, switching during a first mode is shown that corresponds to FIG. 4A. The switch SW1 is turned on and off at a selected duty cycle between 1% and 99% (approximately 50% in this example) and the second switch SW2 remains off (0% duty cycle). The third switch SW3 is turned on and off at the selected duty cycle (with timing that is opposite the timing of the first switch SW1) and the fourth switch SW4 remains off.

Figure 5E:
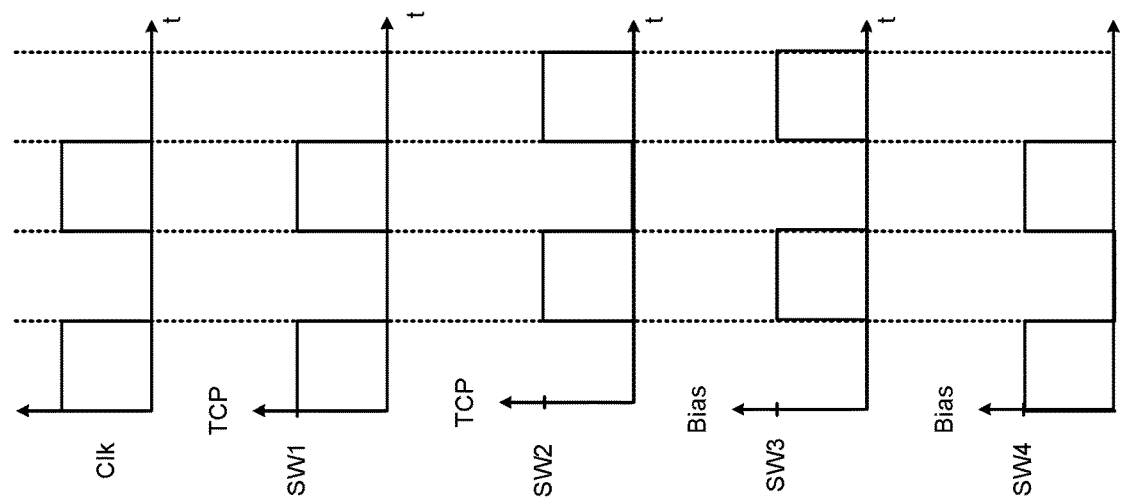
Figure 5D:
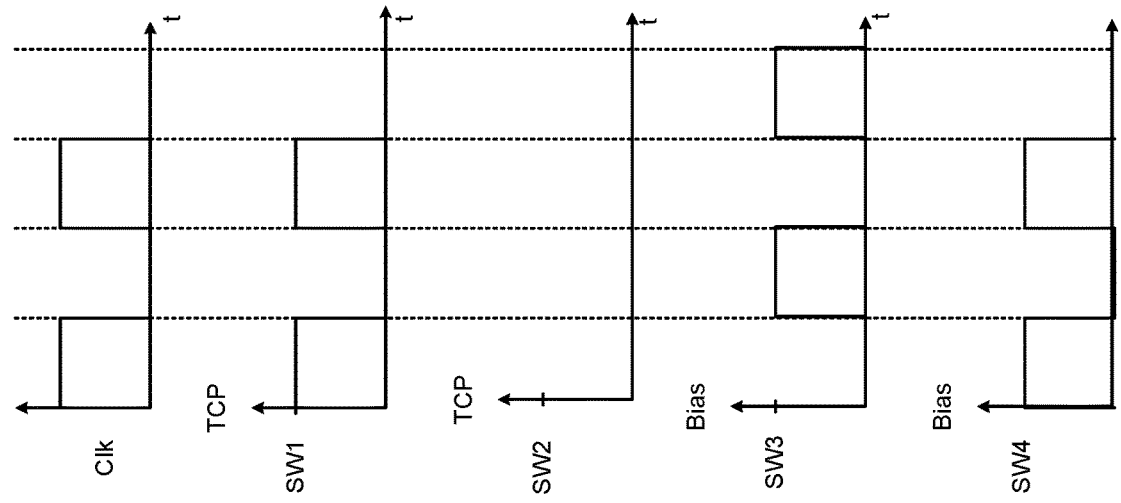
Figure 5C:
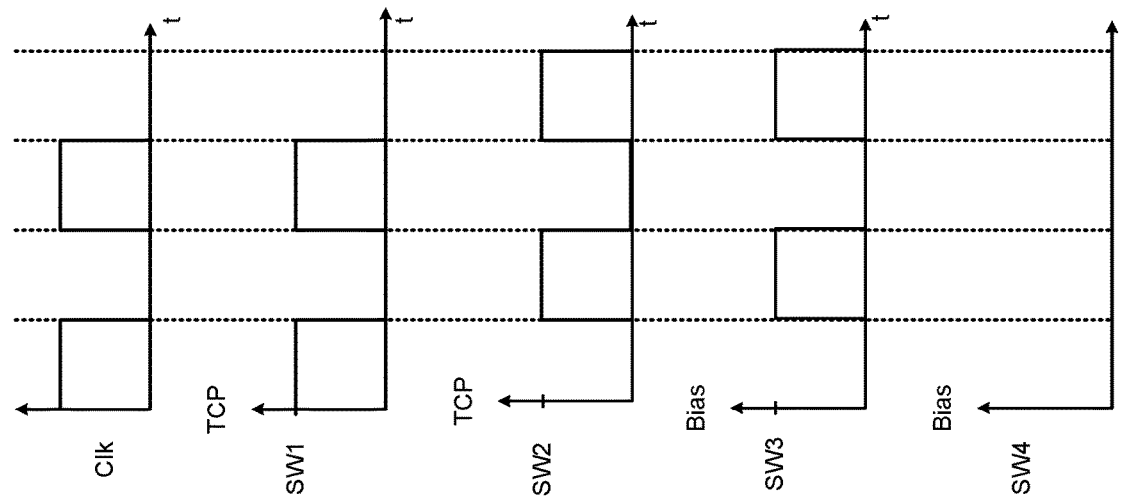

In FIG. 5C, switching during a second mode is shown that corresponds to FIG. 4B. The switch SW1 is turned on and off at a selected duty cycle between 1% and 99% (approximately 50% in this example) and the second switch SW2 is turned off and on at the selected duty cycle (opposite to switch SW1). The third switch SW3 is turned on and off at the selected duty cycle (with timing that is opposite the timing of the first switch SW1 and the same as the second switch SW2) and the fourth switch SW4 is off.

In FIG. 5D, switching during a third mode is shown that corresponds to FIG. 4C. The switch SW1 is turned on and off at a selected duty cycle between 1% and 99% (approximately 50% in this example) and the second switch SW2 off. The third switch SW3 is turned on and off at the selected duty cycle (with timing that is opposite the timing of the first switch SW1) and the fourth switch SW4 is turned off and on (opposite to switch SW3).

In FIG. 5E, switching during a fourth mode is shown that corresponds to FIG. 4D. The switch SW1 is turned on and off at a selected duty cycle between 1% and 99% (approximately 50% in this example) and the second switch SW2 is turned off and on at the selected duty cycle (opposite to switch SW1). The third switch SW3 is turned on and off in the selected duty cycle (with timing that is opposite the timing of the first switch SW1) and the fourth switch SW4 is turned off and on (opposite to switch SW3).

Figure 6:
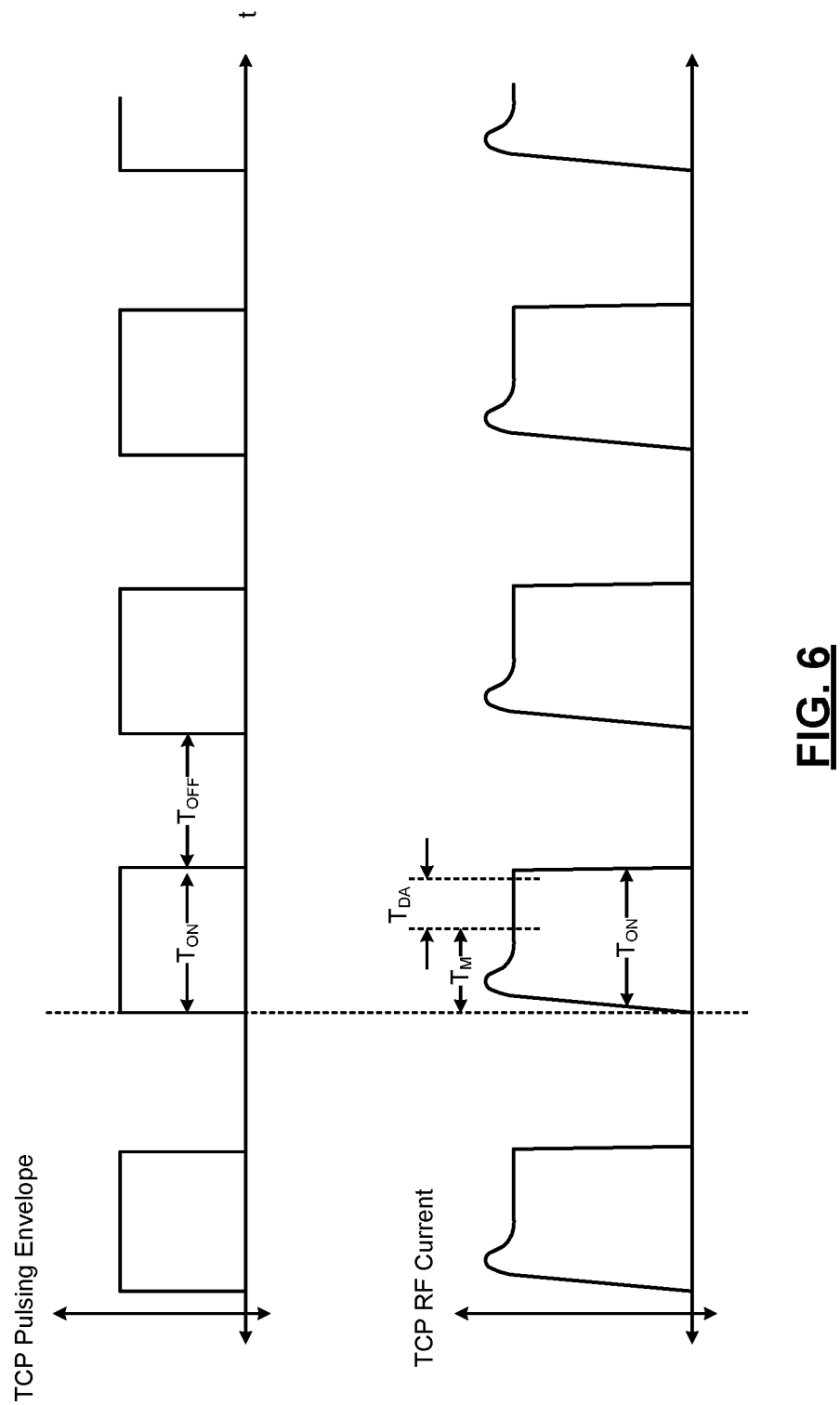
FIG. 6 are graphs illustrating examples of mask and data acquisition periods during a pulsing envelope as a function of time.

Referring now to FIG. 6, plasma voltage (V) and current (I) are sampled during operation by the VI probe. In prior TCP pulsing approaches, RF voltage and current (VI) measurements are taken when one of the switches SW1-SW4 is active during a data acquisition period that occurs after a mask period. The mask period and data acquisition period may correspond to a fixed time interval or a certain percentage of ON time ($T_{ON}$). In addition, a generic set of control gains for impedance tuning and TCCT ratio regulation are applied to the full pulsing window. The measurements are averaged over a fixed number of raw data points. This approach generally works well for certain frequencies and when the duty cycle is approximately 50%.

However, when pulsing frequency ranges from a few Hertz to a few kHz and the duty cycle ranges from 1% (or minimum ON time of 300 uS) to 99%, a single setting for the mask period and data acquisition period, either fixed or percentage of ON time, does not work well for the full operating window in pulsing frequency and duty cycle.

For example for a 1 kHz and 50% pulsing condition, a mask time of 10% or 50 micro seconds and data acquisition time of 50% or 250 micro seconds may work well. However, using the same settings of 50 uS and 250 uS will not work very well for the pulsing condition of 10 Hz and 50% duty cycle. This is due to the fact that pulsing at 10 Hz takes more time than pulsing at 1 kHz to establish stable plasma within each cycle. If the same percentages of 10% and 50%, respectively, are used at 10 Hz pulsing, the data acquisition time at 10 Hz is much longer than at 1 kHz pulsing for each cycle.

On the other hand, at 10 Hz and 50% pulsing condition, a mask time of 50% or 50 mS and data acquisition time of 10% or 1 mS may work well. The same settings at 1 kHz and 10% duty cycle does not allow sufficient time to take voltage and current measurements (i.e., only 10 uS). In extreme situations, pulsing at higher frequency is more like continuous wave (CW) plasma driven by multiple frequencies including the RF frequency (as center frequency) and sidebands. Pulsing at the low frequency end with low duty cycle can become a sequence of turning ON and OFF the plasma with each cycle having a striking transient. As a result, the settings for mask time and data acquisition time need to be adjustable based on the specific pulsing frequency and duty cycle for the full pulsing operation window.

Measurements made by the VI probe 71 and the phase-mag detector 73 within the data acquisition period are used as feedback for closed-loop control of impedance tuning and TCCT ratio regulation. For example when the controller has an update rate of 1 kHz, a single step up or step down TCCT ratio regulation may take hundreds of control cycles to complete the transient with good dynamic response (fast transient with minimum oscillation). But when pulsing at 10 Hz with 10% duty cycle, the ON time is 10 mS. As a result, the control loop updates only 10 times at maximum (when mask time is 0% and data acquisition time is 100% of ON time) in each pulsing cycle. It may take up to 40 to 50 pulsing cycles to reach the TCCT ratio setpoint for a given control system and gain settings. In some examples, it can take 4 to 5 seconds to complete the TCCT regulation, which is longer than desired. To achieve faster regulation such as 1 second or less, systems and methods described herein have learning capability. After training, the systems and methods described herein regulate more quickly (particularly for the low pulsing frequency and low duty cycle conditions).

In some examples, the VI probe 71 and the phase-magnitude detector 73 may take one microsecond (µs) or more to take each measurement. The raw measurements may be averaged to digitally filter out noise before being used in the feedback control loop. Depending on the data acquisition time, there may or may not be a sufficient number of raw data points to be averaged within each control update cycle. As a result, systems and methods described herein adjust the number of averaged data points based on the desired setpoint (as defined by the duty cycle and/or pulse frequency).

The data acquisition period is maximized when the ON time is the shortest (by minimizing the mask time for high pulsing frequency conditions). Some operating conditions need to be blocked. For example, a short ON time (for example, 300 uS) with pulsing frequency at the lower end (e.g., 10 Hz) may not have enough average RF power to strike and/or sustain a stable plasma.

Figure 7:
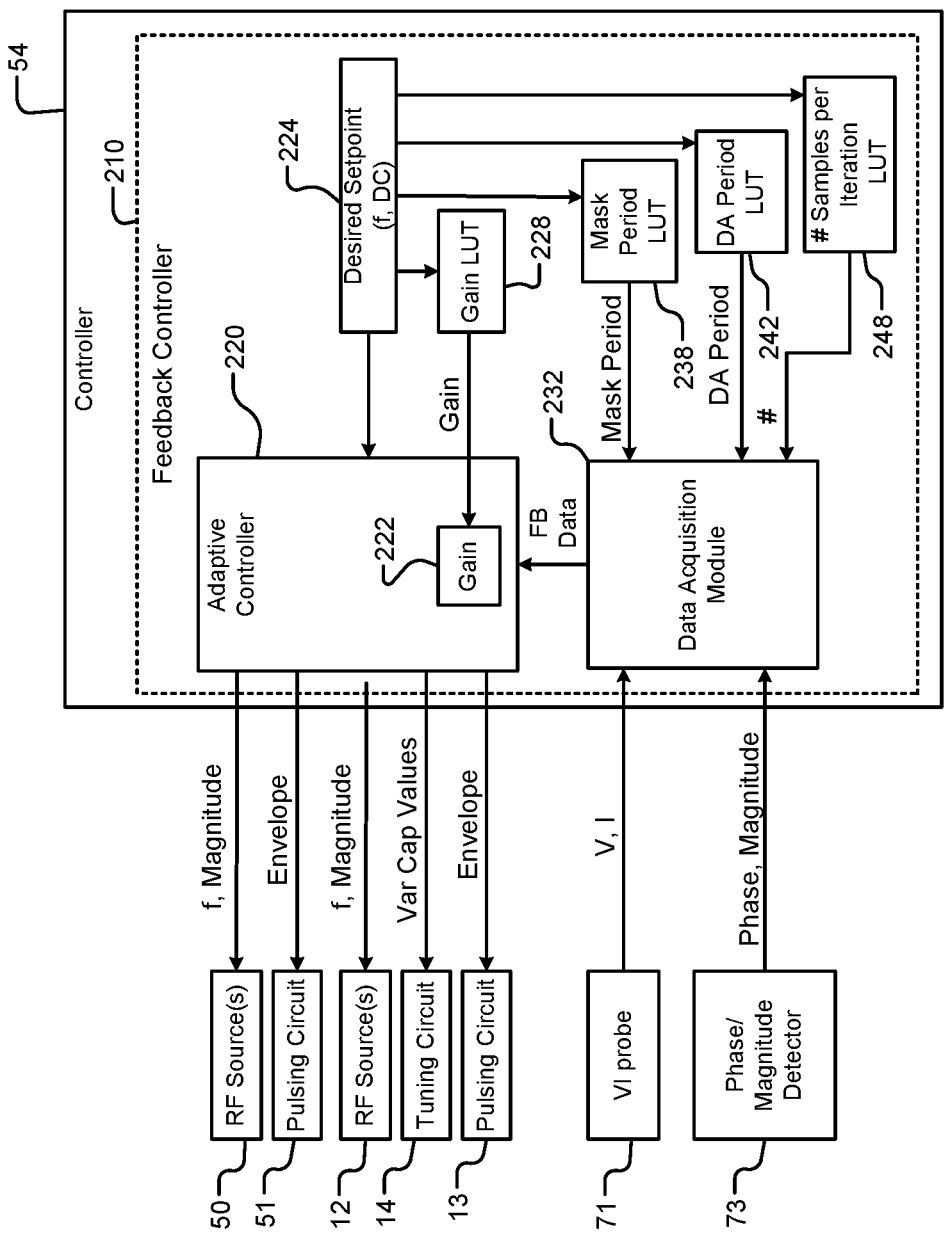
FIG. 7 is a functional block diagram of an example of an adaptive feedback controller according to the present disclosure.

Referring now to FIG. 7, in some examples the controller 54 includes a feedback controller 210. The feedback controller 210 includes an adaptive controller 220 that receives feedback signals and adjusts the variable capacitors in the tuning circuit and/or pulsing frequencies using a variable gain 222. In some examples, the adaptive controller includes a proportional integral derivative (PID) controller, although other types of controllers can be used.

A desired setpoint module 224 stores a desired setpoint set by a user. The desired setpoint may include a duty cycle and one or more pulsing frequencies (f) that are used for the TCP RF power and the RF bias power. The DC may be varied between 1% and 99%.

The desired setpoint module 224 outputs the desired setpoint to a gain lookup table 228, a mask period lookup table 238, a data acquisition (DA) period lookup table 242 and/or a number of samples per iteration lookup table 248. The gain lookup table 228 looks up a gain value based upon the frequency and/or duty cycle setpoint and outputs the gain value to the adaptive controller 220. The mask period lookup table 238 looks up the mask period based upon the frequency and/or duty cycle setpoint and outputs the mask period to a data acquisition module 232. The data acquisition period lookup table 242 looks up the data acquisition period based upon the frequency and/or duty cycle setpoint and outputs the data acquisition period to the data acquisition module 232. The number of samples per iteration lookup table 248 looks up the number of samples to be used for averaging based upon the frequency and/or duty cycle setpoint and outputs the number of samples to the data acquisition module 232.

The data acquisition module 232 receives the output of the VI probe 71 and the output of the phase/magnitude detector 73 and provides feedback data to the adaptive controller 220 based upon the mask period, the data acquisition period and the number of samples to be used for averaging.

Figure 8:
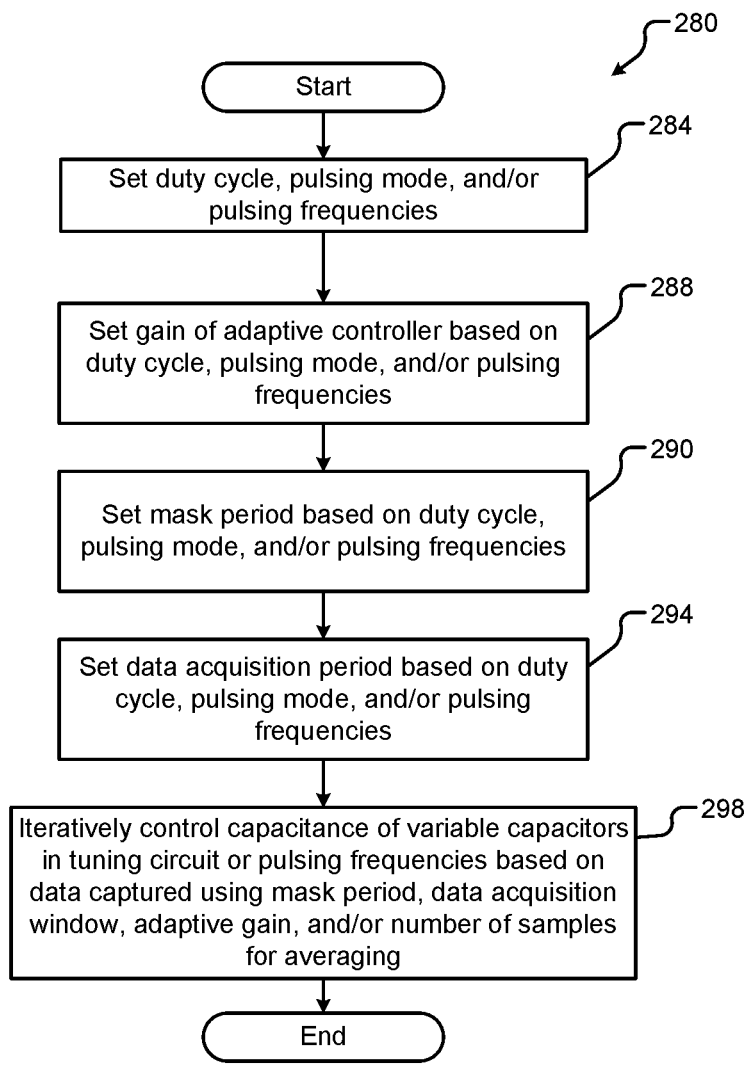
FIG. 8 is a flowchart illustrating an example of a method for controlling variable capacitors and/or pulsing frequencies of the TCP RF power and/or bias RF power using the feedback controller according to the present disclosure.

Referring now to FIG. 8, a method 280 for controlling variable capacitors and/or RF frequencies of the TCP RF power and/or bias RF power is shown. At 284, the duty cycle, pulsing mode, the pulsing frequencies are set to initial values. The desired setpoint is used to select the gain, the mask period, the data acquisition period and/or the number of samples that are used for averaging.

At 288, the gain of the adaptive controller is set based on one or more of the duty cycle, pulsing mode, and/or the pulsing frequencies. At 290, the mask period of the adaptive controller is set based on one or more of the duty cycle, pulsing mode, and/or the pulsing frequencies. At 294, the data acquisition period of the adaptive controller is set based on one or more of the duty cycle, pulsing mode, and/or the pulsing frequencies. At 298, the capacitance of the variable capacitors in the tuning circuit and/or the pulsing frequencies are iteratively controlled using the adaptive gain based on the feedback data that is captured using the mask period, the data acquisition period and/or the number of samples for averaging.

Figure 9:
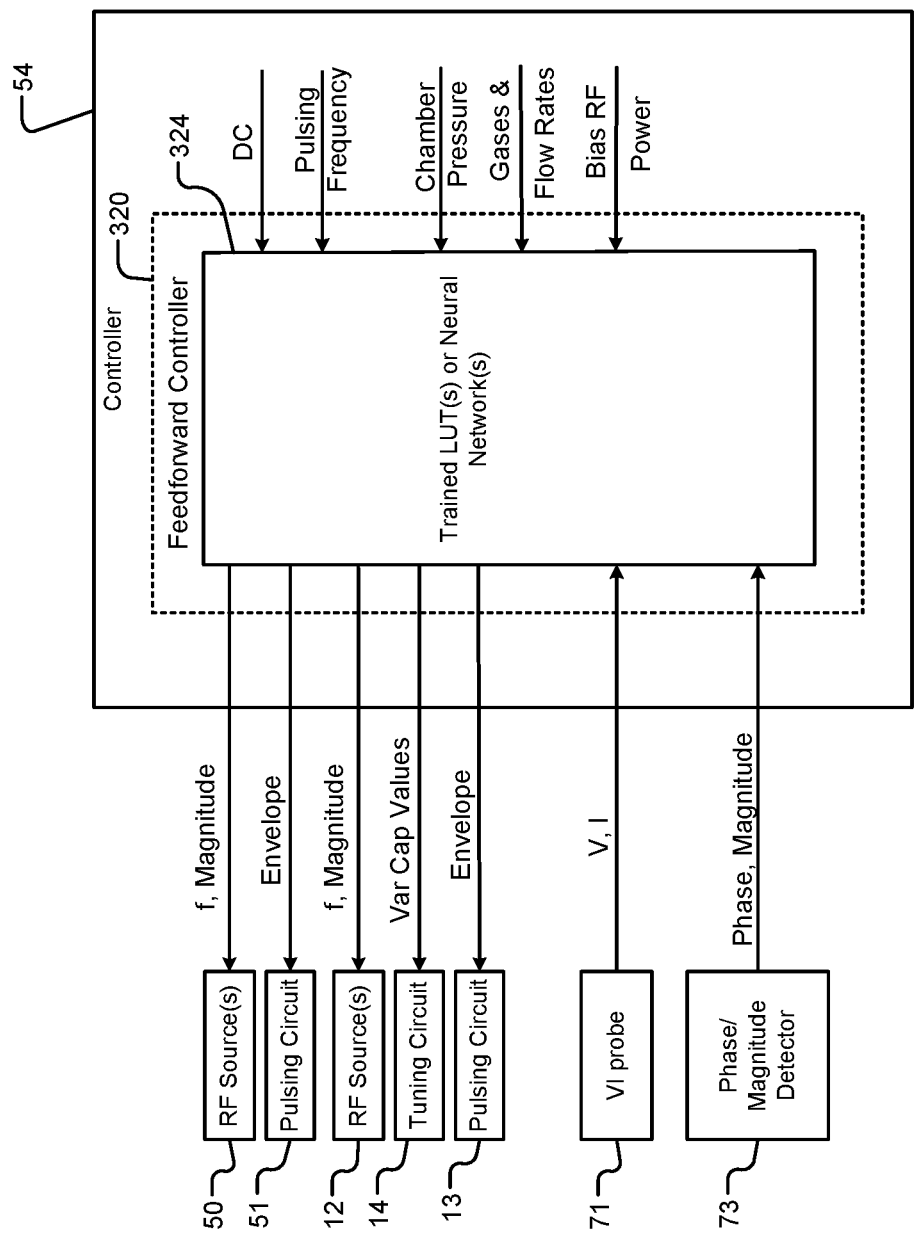
FIG. 9 is a functional block diagram of an example of a feedforward controller according to the present disclosure.

Referring now to FIG. 9, in some examples the controller 54 includes a feedforward controller 320. The feedforward controller 320 comprises one or more trained lookup tables and/or one or more neural networks (identified at 324). The trained lookup tables and/or the one or more neural networks 324 are trained using known input/output data sets. The feedforward controller 320 receives input data relating to the duty cycle, pulsing frequency, and/or chamber conditions such as chamber pressure, gas mixture, gas flow rates, RF bias power and/or TCP RF power, etc. Further inputs may include sensed outputs of the VI probe 71 and the phase magnitude detector 73. The trained lookup tables and/or the one or more neural networks 324 control the variable capacitance values of the tuning circuit 13, pulsing frequencies of the RF sources 12 and 50 and/or variations in the pulsing circuits 14 and 51.

Figure 10:
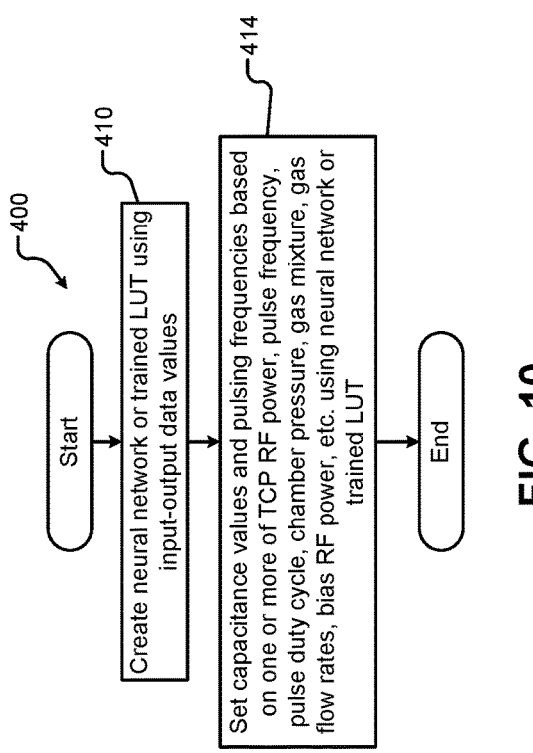
FIG. 10 is a flowchart illustrating an example of a method for controlling variable capacitors and/or pulsing frequencies of the TCP RF power and/or bias RF power using the feedforward controller according to the present disclosure.

Referring now to FIG. 10, a method 400 for controlling variable capacitors and/or RF frequencies of the TCP RF power and/or bias RF power using a feedforward controller is shown. At 410, a neural network and/or trained lookup tables are created using input-output data values. At 414, the capacitance values and/or frequencies are set based on one or more parameters such as TCP RF power, pulse frequency, pulse duty cycle, chamber pressure, gas mixture, gas flow rates, bias RF power, etc. The capacitance values and/or pulsing frequencies that are set may be used during the plasma process. Alternately, the capacitance values and/or pulsing frequencies from the feedforward controller may serve as coarse values that are subsequently tuned by the feedback controller.

Figure 11:
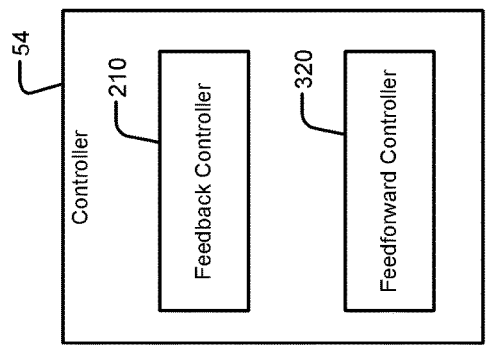
FIG. 11 is a functional block diagram illustrating a controller including a feedforward controller and an adaptive feedback controller according to the present disclosure.
Figure 12:
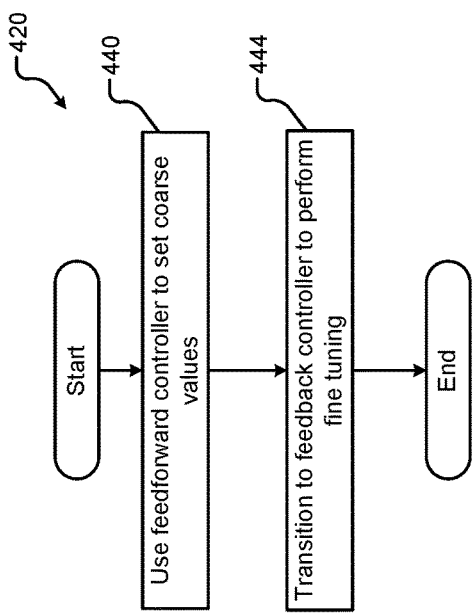
FIG. 12 is a flowchart illustrating operation of the controller of FIG. 11 according to the present disclosure.

Referring now to FIGS. 11-12, both feedback and feedforward control can be used by the controller 54. In FIG. 11, the controller 54 includes the adaptive feedback controller 210 and the feedforward controller 320. In FIG. 12, a method 420 includes using the feedforward controller 320 to perform coarse tuning. After coarse tuning is performed, the feedback controller 210 performs fine tuning.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system, comprising:
   a processing chamber including a substrate support to support a substrate;
   a coil arranged around the processing chamber;
   a first RF source to provide first RF power at a first magnitude and a first frequency;
   a first pulsing circuit to apply a duty cycle to the first RF source;
   a tuning circuit to receive an output of the first pulsing circuit, including a first variable capacitor, and having an output in communication with the coil to generate plasma in the processing chamber; and
   a controller including:
      a data acquisition circuit to generate feedback; and
      a feedback control circuit to control at least one of the first frequency and the first variable capacitor based on the feedback and a gain value, wherein the controller selects the gain value based on at least one of the first frequency and the duty cycle.

2. The substrate processing system of claim 1, further comprising:
   a VI probe to sense a current and a voltage of the plasma; and
   a phase/magnitude detector to detect a phase and a magnitude of the plasma,
   wherein the data acquisition circuit generates the feedback based on outputs of the VI probe and the phase/magnitude detector.

3. The substrate processing system of claim 1, wherein the controller includes a gain lookup table that is indexed by at least one of the duty cycle and the first frequency and selects the gain value from the gain lookup table.

4. The substrate processing system of claim 1, wherein the controller includes a mask period lookup table that is indexed by at least one of the first frequency and the duty cycle and selects a mask period from the mask period lookup table for output to the data acquisition circuit.

5. The substrate processing system of claim 1, wherein the controller includes a data acquisition lookup table that is indexed by the first frequency and the duty cycle and selects a data acquisition period from the data acquisition lookup table for output to the data acquisition circuit.

6. The substrate processing system of claim 1, wherein the controller adjusts a number of samples for averaging performed by the data acquisition circuit on the feedback based on the first frequency and the duty cycle.

7. The substrate processing system of claim 1, wherein the controller includes a feedforward controller to determine coarse tuning of a variable capacitance of the first variable capacitor and the first frequency.

8. The substrate processing system of claim 7, wherein the feedforward controller includes a learned lookup table indexed by at least three of chamber pressure, gas mixtures, gas flow rates, pulsing frequency, RF power and RF bias power.

9. The substrate processing system of claim 7, wherein the feedforward controller includes a neural network having an input including at least three of chamber pressure, gas mixtures, gas flow rates, pulsing frequency and RF power and RF bias power.

10. The substrate processing system of claim 1, wherein:
    the first RF source provides second RF power at a second magnitude and a second frequency, and
    the first pulsing circuit outputs a first portion of the duty cycle at the first frequency and the first magnitude and a second portion of the duty cycle at the second frequency and the second magnitude.

11. The substrate processing system of claim 10, wherein the feedback control circuit further controls the second frequency.

12. The substrate processing system of claim 10, further comprising:
   a second RF source to output third RF power at a third magnitude and a third frequency and fourth RF power at a fourth magnitude and a fourth frequency; and
   a second pulsing circuit to apply the duty cycle to the second RF source and having an output in communication with the substrate support.

13. The substrate processing system of claim 12, wherein the feedback control circuit further controls the third frequency and the fourth frequency.

14. The substrate processing system of claim 12, wherein the second pulsing circuit outputs a first portion of the duty cycle at the third frequency and the third magnitude and a second portion of the duty cycle at the fourth frequency and the fourth magnitude.

15. The substrate processing system of claim 1, wherein the coil includes first and second coils and the tuning circuit includes:
   a matching circuit including the first variable capacitor and a second variable capacitor; and
   a power splitter to split power between the first and second coils and including a third variable capacitor and a fourth variable capacitor.

16. The substrate processing system of claim 15, wherein the feedback control circuit controls the first frequency and capacitance values of the first variable capacitor, the second variable capacitor, the third variable capacitor and the fourth variable capacitor based on at least one of the feedback and the gain value.

* * * * *